Figure 1:
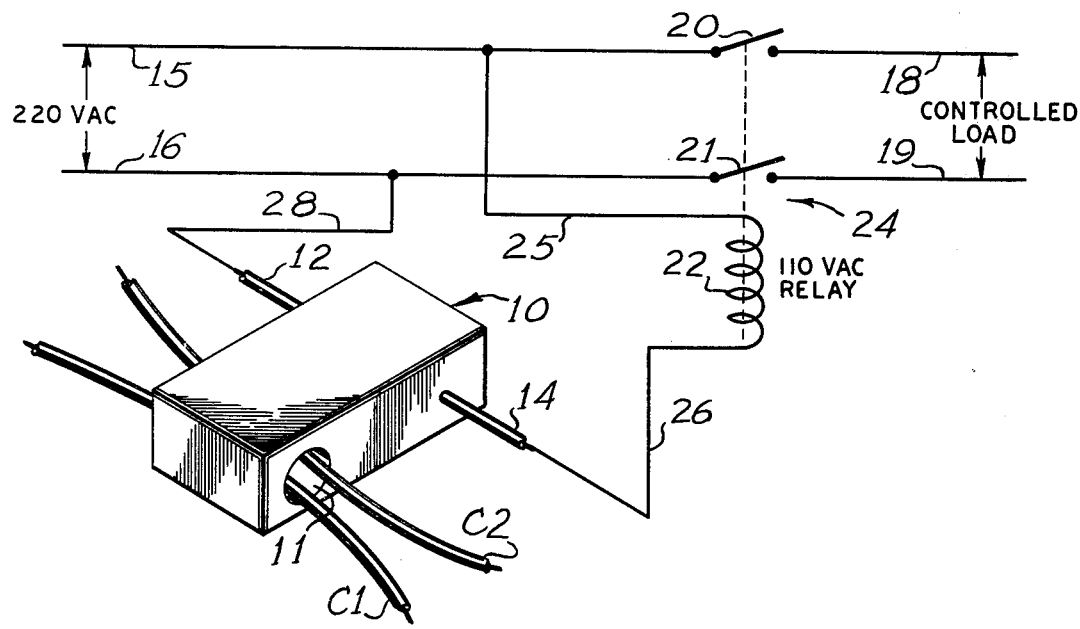

United States Patent [19]

Sturrock

[11] 4,163,271
[45] Jul. 31, 1979

[54] ELECTRONIC SWITCHING APPARATUS

[75] Inventor: James C. Sturrock, Atlanta, Ga.

[73] Assignee: Michael L. Manning, Athens, Ga.

[21] Appl. No.: 830,089

[22] Filed: Sep. 2, 1977

[51] Int. Cl.² .................. H03K 17/00; H03K 17/72
[52] U.S. Cl. .................................. 361/93; 307/86; 307/252 N
[58] Field of Search ........... 307/252 N, 252 J, 252 W, 307/86; 361/35, 93

[56] References Cited
FOREIGN PATENT DOCUMENTS
2160251 6/1972 Fed. Rep. of Germany ...... 307/252 N Primary Examiner—John Zazworsky
Attorney, Agent, or Firm—James B. Middleton

[57] ABSTRACT

An electronic switching apparatus comprising an elongate device having an opening in one end thereof for receipt of an electric conductor therethrough, a transformer winding surrounding the opening within the device such that a voltage will be induced in the transformer when a current passes through the conductor, means for detecting the induced voltage and providing a shunt in response to the induced voltage, a path through the device having a controlled rectifier therein, the rectifier having a gate, a circuit connecting the gate to the path for causing the rectifier to conduct, the shunt providing a shunt around the gate to prevent the rectifier from conducting.

3 Claims, 2 Drawing Figures

ELECTRONIC SWITCHING APPARATUS

This invention relates to electronic switching apparatus, and is more particularly concerned with a switching apparatus wherein the completion or interruption of a circuit is determined by the presence or absence of current in a separate circuit.

There are numerous instances in which one desires to control an electrical load automatically, that is, to supply power to the load or to remove power from the load based on certain conditions. In many instances it is desirable to control one load on the basis of whether or not one or more other loads are energized at the particular time.

In the past, the most frequently used form of sensing means has been a current transformer, which comprises a coil of wire having a large number of turns in the coil. Current passing through a wire, with the wire passing through the center of the coil, induces a voltage in the coil so that the voltage from the current transformer can be used in various ways. However, a current transformer tends to be very large and very heavy because of the great number of turns of wire that are necessary to have a voltage of any usable magnitude induced in the coil, especially when dealing with small currents. This makes the current transformer very unhandy, and difficult to use in many situations. Other forms of sensing devices include the very simple expedient of placing some device in parallel with the switch that operates a load, such that when the load is operating some other device is also operating. While this simple expedient may be effective, it generally requires a large amount of additional wiring since separate wires must be connected between the load to be controlled and the other apparatus that is connected in parallel with the load.

The present invention overcomes the above mentioned and other difficulties with the prior art by providing a switching means which comprises a current sensing means for determining when a current is present, and switch means operable by said current sensing means. The present invention further includes a switch means that is operable for only a half-cycle of an alternating current so that the effective voltage is cut approximately in half. As a result, if the voltage to be controlled is 220 volts A.C., the relay coil or other control means can be designed to operate on the lower voltage of approximately 110 volts without separate voltage sources, transformers or the like. The apparatus made in accordance with the present invention is quite simple and readily lends itself to construction with solid state components so that the entire device can be very small and light weight.

Figure 2:
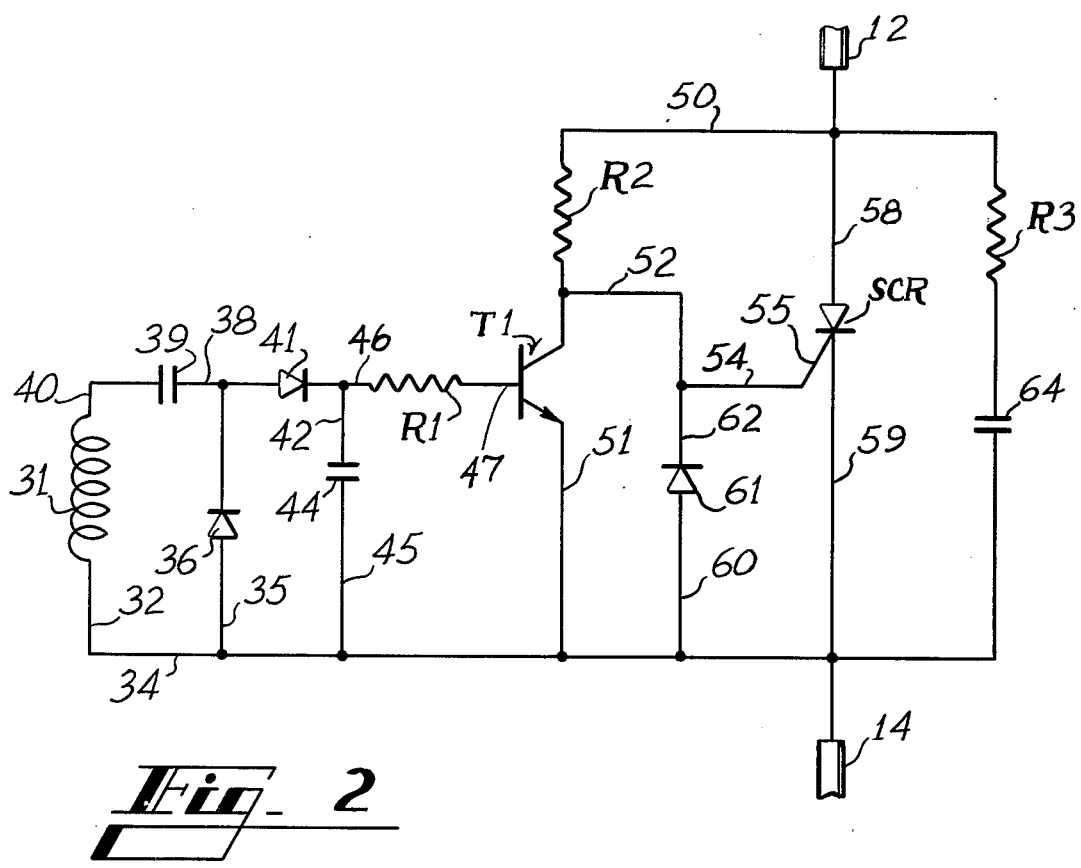

These and other features and advantages of the present invention will become apparent from consideration of the following specification when taken in conjunction with the accompanying drawing in which:

FIG. 1 is a partially pictorial and partially schematic view showing a switching apparatus made in accordance with the present invention and illustrating one form of electrical connection to control an electrical load; and, FIG. 2 is a schematic circuit diagram showing one embodiment of switching apparatus of the present invention.

Referring now more particularly to the drawing, and to that embodiment of the invention here chosen by way of illustration, it will be seen in FIG. 1 that the device of the present invention is indicated generally by the numeral 10 and includes a generally circular opening 11 in one end thereof, and includes a pair of electrical leads 12 and 14 extending outwardly from the opposite end thereof. The switching device 10 is shown as being substantially rectangular in overall shape, and it should be understood that the device shown in FIG. 1 of the drawing is a housing, or module, which may be of any shape and size desired, or appropriate, to contain the circuitry and other portions of the present invention.

Referring further to FIG. 1 of the drawing it will be seen that a supply voltage is provided on a pair of wires 15 and 16; and, by way of example, the voltage between the wires 15 and 16 is indicated as 220 volts A.C. The wires 15 and 16 lead to the controlled load which is indicated as being connected between wires 18 and 19. It will be understood by those skilled in the art that any thing or device operated electrically could constitute the controlled load without regard to the precise function of the electrical power.

Connected between the wires 15 and 16 and the wires 18 and 19, there is indicated a pair of switches 20 and 21, the switch 20 being between the wires 15 and 18, and the switch 21 being between the wires 16 and 19. As indicated by the broken line, the switches 20 and 21 are ganged for simultaneous operation, and are operated by the coil 22 which is here labeled as a 110 volt A.C. relay coil. It will therefore be understood that the drawing indicates a substantially conventional relay generally designated at 24, the relay comprising the coil 22 with two normally open contacts 20 and 21.

One side of the coil 22 is connected, by means of a wire 25, to the wire 15, while the opposite side of the coil 22 is connected by means of a wire 26 to the wire 14 extending from the device 10. The wire 12 extending from the device 10 connects to a wire 28 which is then connected to the wire 16. As a result, it will be seen that the relay coil 22 is connected in parallel with the 220 volt source indicated by the wires 15 and 16, but the device 10 is interposed in one side of the circuit to act as a switch to control the energization of the coil 22. It will therefore be understood that, when the circuitry of the device 10 creates a conducting path between the wires 12 and 14, the relay coil 22 will be energized; and, when the circuitry of the device 10 does not provide a conducting path between the wires 12 and 14, the relay coil 22 will not be energized.

As will be discussed more fully hereinafter, it will be understood that the wires C1 and C2 indicate two separate circuits which are not shown here in detail; however, so long as no current is flowing in either of the circuits represented by the wires C1 and C2, the device 10 causes the path between the wires 12 and 14 to be an electrically conducting path so that the relay coil 22 is simply placed in parallel with the wires 15 and 16 to cause the coil 22 to be energized. While the relay coil 22 is indicated as being a 110 volt coil and the voltage source indicated by the wires 15 and 16 is indicated as being a 220 volt source, it will be shown hereinafter that the nature of the embodiment of the present invention here shown is such that the effective voltage will be appropriately reduced so that the 110 volt coil will operate properly.

When the relay coil 22 is energized, it will be understood that the switches 20 and 21 will be moved from their normal position as shown, to their transferred position which is closed, thereby placing the controlled load indicated by the wires 18 and 19 in a complete circuit from the wires 15 and 16.

When a current flows through either the wire C1 or the wire C2, the circuitry of the device 10 will detect the current and cause the path between the wires 12 and 14 to stop conducting. This effectively opens the circuits so that the relay coil 22 is no longer energized from the conductors 15 and 16 so that the relay 24 will be de-energized, allowing the switches 20 and 21 to return to their normal position as shown in the drawing, thereby to de-energize the controlled load by removing the voltage from the wires 18 and 19.

It will therefore be seen that the device of the present invention can be very quickly and easily connected into any given circuit to control a load in that circuit; and, one or more conductors, such as a conductor C1 and C2, can be simply passed through the opening 11 to effect the desired control on the controlled load.

Referring now to FIG. 2 of the drawing, it should first be understood that the schematically shown circuit in FIG. 2 of the drawing would be housed within the device 10 shown in FIG. 1 of the drawing; and, the coil 31 shown in FIG. 2 of the drawing would be so located within the device 10 that the conductors C1 and C2 would pass through the coil when they pass through the opening 11. Further, the wires 12 and 14 shown in FIG. 1 of the drawing are represented at 12 and 14 in FIG. 2 of the drawing. With these preliminaries in mind, a detailed description of the circuitry follows.

It should first be mentioned that, when a current flows through a wire or other conductor, a magnetic field is built up around the conductor, the magnetic field being proportional in intensity to the current flowing through the conductor. As a result, a coil of wire can be placed around a conductor; and, when a current flows through a conductor, the build-up of the magnetic field around the conductor will cause the magnetic lines of force to cut the conductors of the coil of wire, thereby inducing a voltage in the coil of wire. As a result, when the current flowing through the conductor is an alternating current, the magnetic field builds up and collapses as the current rises from zero to the maximum value then falls back to zero. With such a fluctuating magnetic field, a coil placed around a conductor carrying an alternating current will have an alternating voltage induced therein, the induced voltage being proportional to the intensity of the current flowing through the conductor and the number of turns of wire in the coil.

With the foregoing in mind, it will be seen that the coil 31 constitutes a means for providing a signal in response to current flowing through a conductor. As the magnetic field builds up around the conductor, a voltage in a first direction will be induced in the coil 31; and, as the magnetic field around the conductor collapses as the current moves towards zero, a voltage will be induced in the coil 31 in the opposite direction. The coil 31 will therefore have an alternating voltage induced therein. When the coil 31 has a first voltage induced therein which causes a current to tend to flow from the coil 31, through the wire 32 and to the bus 34, it will be seen that the current can flow through the wire 35 and through the diode 36 to the opposite bus 38. The bus 38 then has a capacitor 39 connected therein, the capacitor 39 being connected to the opposite side 40 of the coil 31. A complete circuit is therefore provided which will allow current to flow as long as the voltage is present or until the capacitor 39 is fully charged.

When current flows in the opposite direction due to the opposite voltage's being induced in the coil 31, current will flow first to the wire 40, through the capacitor 39 (which will cause discharge of the capacitor 39), then through the bus 38, and through the diode 41 which is connected in the bus 38. Current can then flow through the wire 42 which has a capacitor 44 connected therein, the capacitor 44 being connected by a wire 45 back to the bus 34. It will therefore be seen that, when the opposite voltage is induced in the coil 31, a complete circuit is provided from the wire 40, through the capacitor 39 and through the bus 38, through the diode 41 and through the wires 42 and 45 with their included capacitor 44, thence through the bus 34, the wire 32 and back to the coil 31. Current can flow in this circuit as long as the voltage is present, until the capacitor 44 is fully charged, and/or until the capacitor 39 is fully charged in the opposite direction.

From the foregoing discussion, it will be understood that when a voltage is induced in the coil 31, in either direction, a voltage is applied to the end 46 of the resistor R1.

Looking now at the tabs 12 and 14 where the device would be connected into a circuit as shown in FIG. 1 of the drawing, it will be understood that an alternating voltage is applied between the tabs 12 and 14. This will be understood by reference to FIG. 1 of the drawing where it will be seen that the voltage would be applied from the wire 15, through the wire 25 and the coil 22, then through the wire 26 to the wire, or tab, 14 while the wire 16 is connected through wire 28 directly to the wire, or tab, 12. There will therefore be a voltage across the wires 12 and 14, the voltage being reduced due to the voltage drop across the relay coil 22.

Returning now to FIG. 2 of the drawing, the voltage between the tabs 12 and 14 tends to cause a current to flow from the tab 12, through the wire 50, then through the resistor R2 and to the transistor T1, then from the transistor T1, through the wire 51 and to the bus 34 where the tab 14 is connected. It will be understood that current cannot flow through the circuit described unless the transistor T1 is in a state to be conducting, therefore, the transistor T1 will control the flow of current from the tab 12, through the wire 50 and resistor R2, through the transistor T1, the wire 51 to the bus 34, then to the tab 14.

So long as the transistor T1 is not conducting, it will be understood that the voltage will be applied from the wire 50, through the resistor R2, then through the branch wire 52 which is connected by a wire 54 to the gate 55 of a silicon controlled rectifier indicated at SCR.

Those skilled in the art will understand that, when the appropriate voltage is applied to the gate 55 of the SCR, the SCR will conduct, but in only one direction; therefore, so long as the voltage is applied to the gate 55 of the SCR, there will be a conducting path from the tab 12, through the wire 58, through the SCR then through the wire 59 and to the tab 14; however, there will not be a conducting path from the tab 14 through the SCR to the tab 12 since the SCR will not allow current to pass in the opposite direction.

Returning now to the coil 31, it will be understood that, when a current flows through a conductor so that a voltage is induced in the coil 31, this voltage will be detected by the circuits previously described to place a voltage on the resistor R1. The resistor R1 is connected to the base 47 of the transistor T1. When a voltage is placed on the base of the transistor T1, the emitter-collector circuit will conduct so that the circuit is completed from the wire 50, through the resistor R2 and through the emitter-collector circuit of the transistor T1, then through the wire 51 and to the bus 34. The completion of this circuit shunts the voltage around the gate 55 so that the gate 55 of the SCR has insufficient voltage to trigger the SCR. As a result, the SCR does not conduct and the circuit between the tabs 12 and 14 through the wires 58 and 59 is not completed.

With the foregoing in mind, it should now be understood that, with the device connected into a circuit as shown in FIG. 1 of the drawing, when no current is flowing in the conductor C1 or C2 so that the coil 31 has no voltage induced therein, there will be a zero voltage on the base 47 of the transistor T1 so that the emitter-collector circuit of the transistor T1 will not conduct. The voltage applied from the wire 16, through the tab 12 and through the wire 50, resistor R2 and branch wire 52 and wire 54 will place sufficient potential on the gate 55 of the SCR to cause the SCR to conduct. This results in a complete circuit from the tab 12 through the wire 58, through the SCR then through the wire 59 to the tab 14. It will be understood however that, since the SCR conducts in only one direction, the current through the circuit described will provide a half-wave rectified voltage through the relay coil 22. Those skilled in the art will realize that, when dealing with alternating currents, it is the "effective" voltage that is important in the operation of various devices rather than the maximum voltage, and an alternating voltage that is rectified so that only a half wave is provided yields an effective voltage of about half the effective voltage of either the original alternating voltage or of full-wave rectification. For this reason, the relay or other device can be rated at about half the voltage of the supply voltage indicated on the wires 15 and 16.

When the SCR is conducting, an alternate path is provided for the current flowing in the opposite direction. This alternate path is from the bus 34, through the line 60, through a diode 61, then through the wire 62 which connects to the wire 52, thence to the resistor R2, through the wire 50 and back to the tab 12. IT will therefore be seen that a first complete circuit is provided through the SCR for flow of current in the first direction, and a second circuit is provided through the diode 61 for current flowing in the opposite direction. The diode 61 is of course necessary to prevent the path through the wire 52, the wire 62 and the wire 60 from being a complete shunt around the transistor T1.

Those skilled in the art will further realize that the inherent nature of a silicon controlled rectifier such as that here indicated at SCR is such that when there is no voltage on the gate 55 of the SCR, as soon as the voltage is removed from the wire 58, the SCR will stop conducting. When a silicon controlled rectifier is used with a direct current, this inherent feature causes no problems; however, in the case of an alternating current it must be remembered that the voltage falls to zero twice for each cycle, and this falling to zero is sufficient to cut off the SCR. Also, since the apparatus of the present invention is intended to control all manner of loads, many of which will be highly inductive loads it will be understood that the SCR may inadvertently be turned off simply because of the falling to zero of the alternating voltage and the badly lagging alternating current. To prevent such an inadvertent cutting off of the SCR, there is a resistor R3 connected in series with a capacitor 64, this network being connected between the wires 50 and the bus 34. This network is sufficient to provide a voltage between the wire 50 and the bus 34 to maintain the SCR in its conducting state during the instantaneous removal of potentials.

From the foregoing discussion, it should be understood that the apparatus of the present invention provides a very simple switch means for controlling an electrical load. The switch means for the present invention includes the sensing means for sensing a current in one circuit, the sensing of current in the one circuit being used as the control signal to open the switch means of the device of the present invention so that one device is controlled in response to the operation of another. Since the simple passing of a wire or other conductor through the opening 11 in the device of the present invention is all that is required to connect the device of the invention to the circuit, it is very simple for one or more circuits to act as the master circuit from which another circuit will be controlled.

It will of course be understood by those skilled in the art that the particular embodiment of the invention here chosen is by way of illustration only, and is meant to be in no way restrictive; therefore, numerous changes and modifications may be made, and the full use of equivalents resorted to, without departing from the spirit or scope of the invention as defined by the appended claims.

I claim:

1. In a plurality of electrical circuits wherein a first circuit of said plurality of electrical circuits controls a second circuit of said plurality of electrical circuits, said second circuit having a supply voltage and a load, and switch means for selectively disconnecting said load from said second circuit, first relay means for operating said switch means for selectively disconnecting said load, and switching apparatus for operating said first relay means in response to a current in said first circuit, said switching apparatus being characterized by sensing means for sensing an electric current in said first circuit, said sensing means comprising a coil adjacent to said first circuit for having a voltage induced therein, detecting means for determining when said sensing means senses an electric current in said first circuit, first selective conducting means connected in series with said first relay means for selectively energizing said first relay means, said first selective conducting means including a gate for causing said first selective conducting means to conduct, circuit means connecting said gate to said supply voltage, and second selective conducting means for shunting said supply voltage around said gate in response to said detecting means, and further characterized in that said first relay means is constructed to operate on a voltage of approximately half said supply voltage.

2. Switching apparatus as claimed in claim 1, said first selective conducting means comprising a silicon controlled rectifier for allowing electric current to flow in a first direction therethrough while blocking current flow in a second direction therethrough, said current sensing means comprising a transformer having an opening therethrough for receiving a conductor of said first circuit.

3. Switching apparatus as claimed in claim 2, said opening through said transformer being of such size as to receive a plurality of conductors therethrough for sensing current in a plurality of circuits.

* * * * *